（12) United States Patent
Das et al.

(10) Patent No.: US 11,784,452 B2
(45) Date of Patent: Oct. 10, 2023

(54) OPTICAL ELEMENT FOR A DEEP ULTRAVIOLET LIGHT SOURCE

(71) Applicant: Cymer, LLC, San Diego, CA (US)

(72) Inventors: Saptaparna Das, San Diego, CA (US); Eric Anders Mason, San Diego, CA (US); John Theodore Melchior, San Diego, CA (US)

(73) Assignee: Cymer, LLC, San Diego, CA (US)

( * ) Notice: Subject to any disclaimer, the term of this patent is extended or adjusted under 35 U.S.C. 154(b) by 62 days.

(21) Appl. No.: 17/429,218

(22) PCT Filed: Feb. 5, 2020

(86) PCT No.: PCT/US2020/016828
§ 371 (c)(1),
(2) Date: Aug. 6, 2021

(87) PCT Pub. No.: WO2020/176205
PCT Pub. Date: Sep. 3, 2020

(65) Prior Publication Data
US 2022/0102929 A1    Mar. 31, 2022

Related U.S. Application Data

(60) Provisional application No. 62/835,646, filed on Apr. 18, 2019, provisional application No. 62/809,983, filed on Feb. 25, 2019.

(51) Int. Cl.
*H01S 3/30* (2006.01)
*H01S 3/034* (2006.01)
(Continued)

(52) U.S. Cl.
CPC .......... *H01S 3/0346* (2013.01); *H01S 3/0835* (2013.01); *H01S 3/08059* (2013.01);
(Continued)

(58) Field of Classification Search
CPC .. H01S 3/0346; H01S 3/08059; H01S 3/0835; H01S 3/0811; H01S 3/0971; H01S 3/225; H01S 3/2308
See application file for complete search history.

(56) References Cited

U.S. PATENT DOCUMENTS 5,978,409 A    11/1999   Das et al.
6,514,674 B1    2/2003   Iwasaki
(Continued)

FOREIGN PATENT DOCUMENTS

JP    2000114635 A    4/2000
JP    2000258607 A    9/2000
(Continued)

OTHER PUBLICATIONS

Robert Laenen, European International Searching Authority, International Search Report and Written Opinion, counterpart PCT Application No. PCT/US2020/016828, dated May 13, 2020, 13 pages total.
(Continued)

*Primary Examiner* — Kinam Park
(74) *Attorney, Agent, or Firm* — DiBerardino McGovern IP Group LLC

(57) ABSTRACT

An optical element for a deep-ultraviolet light source includes a crystalline substrate; a coating on an exterior surface of the crystalline substrate, the coating having a thickness along a direction that extends away from the exterior surface; and a structure on and/or in the coating, the structure including a plurality of features that extend away from the crystalline substrate along the direction. The features include an amorphous dielectric material and are arranged such that an index of refraction of the structure varies along the direction.

29 Claims, 8 Drawing Sheets

(51) Int. Cl.
- *H01S 3/08* (2023.01)
- *H01S 3/083* (2006.01)
- *H01S 3/225* (2006.01)
- *H01S 3/23* (2006.01)
- *H01S 3/081* (2006.01)
- *H01S 3/0971* (2006.01)

(52) U.S. Cl.
CPC .......... *H01S 3/0811* (2013.01); *H01S 3/0971* (2013.01); *H01S 3/225* (2013.01); *H01S 3/2308* (2013.01)

(56) References Cited

U.S. PATENT DOCUMENTS

| | | | |
|---|---|---|---|
| 8,624,209 B1* | 1/2014 | Rafac | H01S 3/235 372/55 |
| 2003/0026001 A1 | 2/2003 | Heller et al. | |
| 2008/0204862 A1* | 8/2008 | Wang | G02B 5/0833 359/359 |
| 2009/0296755 A1 | 12/2009 | Brown et al. | |
| 2010/0097592 A1* | 4/2010 | Kraehmer | G02B 17/0812 359/733 |
| 2010/0149510 A1* | 6/2010 | Zaczek | G02B 1/118 216/24 |
| 2012/0225220 A1* | 9/2012 | Jose | H01S 3/2308 427/596 |
| 2015/0062713 A1 | 3/2015 | Hart et al. | |
| 2016/0085003 A1* | 3/2016 | Jaiswal | G03F 7/70958 250/307 |
| 2017/0205546 A1 | 7/2017 | Wada et al. | |
| 2017/0307782 A1* | 10/2017 | Poutous | C03C 15/00 |
| 2017/0365371 A1 | 12/2017 | Huang et al. | |
| 2018/0017878 A1* | 1/2018 | Bibby, Jr | G01J 1/4257 |
| 2018/0149523 A1* | 5/2018 | Zhao | G03F 7/7085 |
| 2018/0217298 A1* | 8/2018 | Mizuguchi | G02B 1/14 |
| 2019/0278179 A1 | 9/2019 | Kelkar | |

FOREIGN PATENT DOCUMENTS

| | | |
|---|---|---|
| JP | 2001290001 A | 10/2001 |
| JP | 2003149418 A | 5/2003 |
| JP | 2005257769 A | 9/2005 |
| JP | 2016024294 A | 2/2016 |
| TW | 201027267 A | 7/2010 |
| WO | 2016086204 A1 | 6/2016 |

OTHER PUBLICATIONS

Douglas Hobbs, "Laser damage threshold measurements of anti-reflection microstructures operating in the near UV and mid-infrared," Proc. SPIE, 7842-77, Sep. 29, 2010.

Douglas Hobbs et al., "Continued advancement of laser damage resistant optically functional microstructures," Proc. SPIE 8530-20, pp. 1-22, Sep. 25, 2012, Boulder Laser Damage XLIV (2012).

Yung-Jr Hung et al., "Fabrication of Highly Ordered Silicon Nanowire Arrays With Controllable Sidewall Profiles for Achieving Low-Surface Reflection," IEEE J. Selected Topics Quantum Elecs., vol. 17, No. 4, 869-77 (2011).

Chengpeng Zhang et al., "Optimization and continuous fabrication of moth-eye nanostructure array on flexible polyethylene terephthalate substrate towards broadband antireflection," Applied Optics, vol. 56, No. 10, 2901-07, Apr. 1, 2017.

Office Action, Korean Intellectual Property Office, counterpart Korean Patent Application No. 10-2021-7026539, dated Aug. 16, 2022, 10 pages total (including English translation of 4 pages).

Office Action, Japan Patent Office Examiner Hidenao Tanaka, counterpart Japanese Patent Application No. 2021-544549, dated Aug. 4, 2022, 6 pages total (including English translation of 3 pages).

* cited by examiner

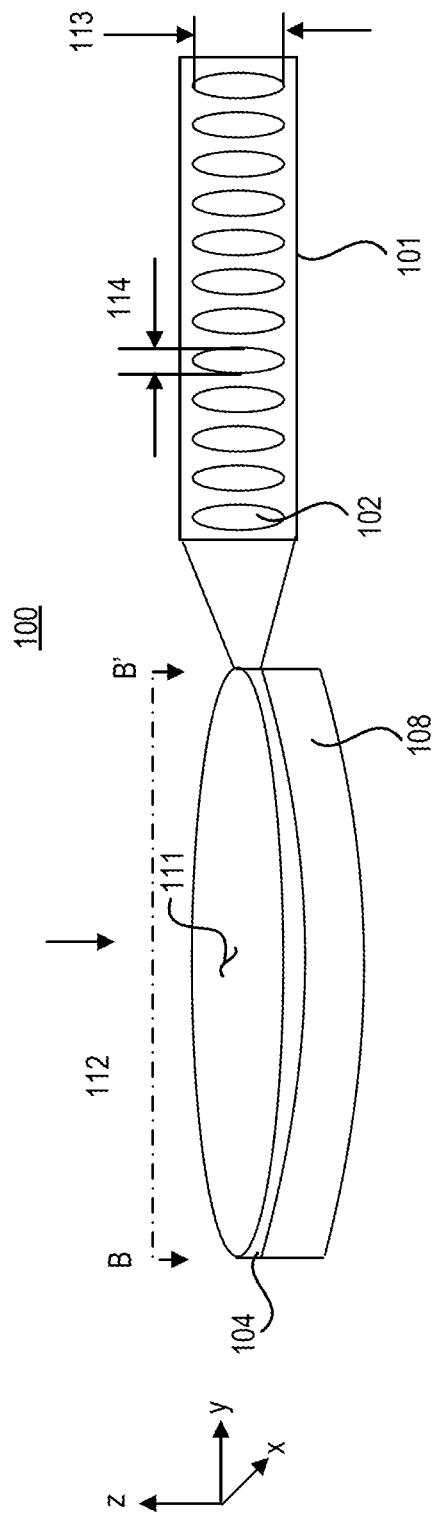
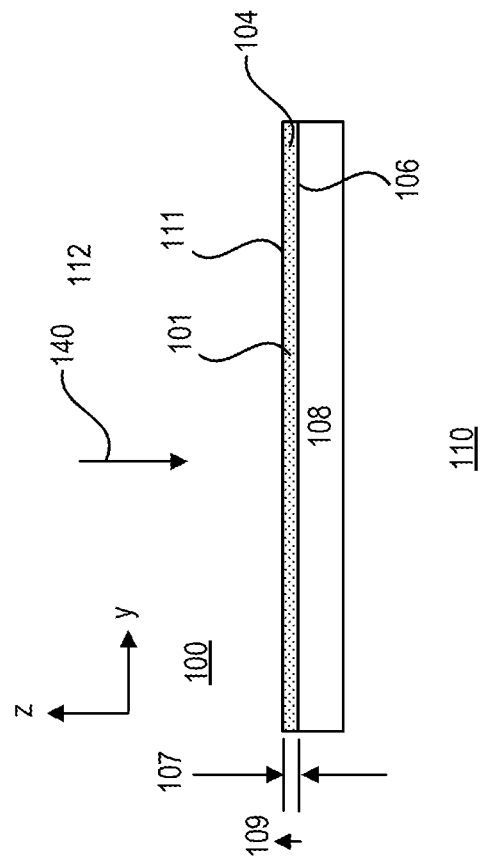
FIG. 1A
FIG. 1B

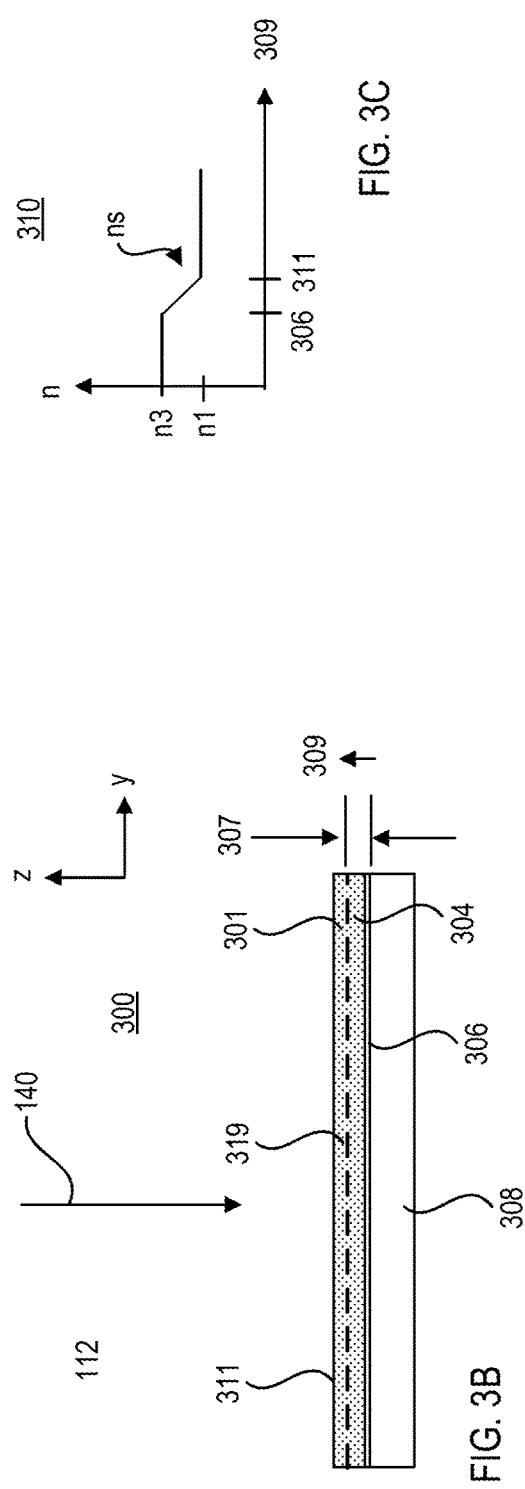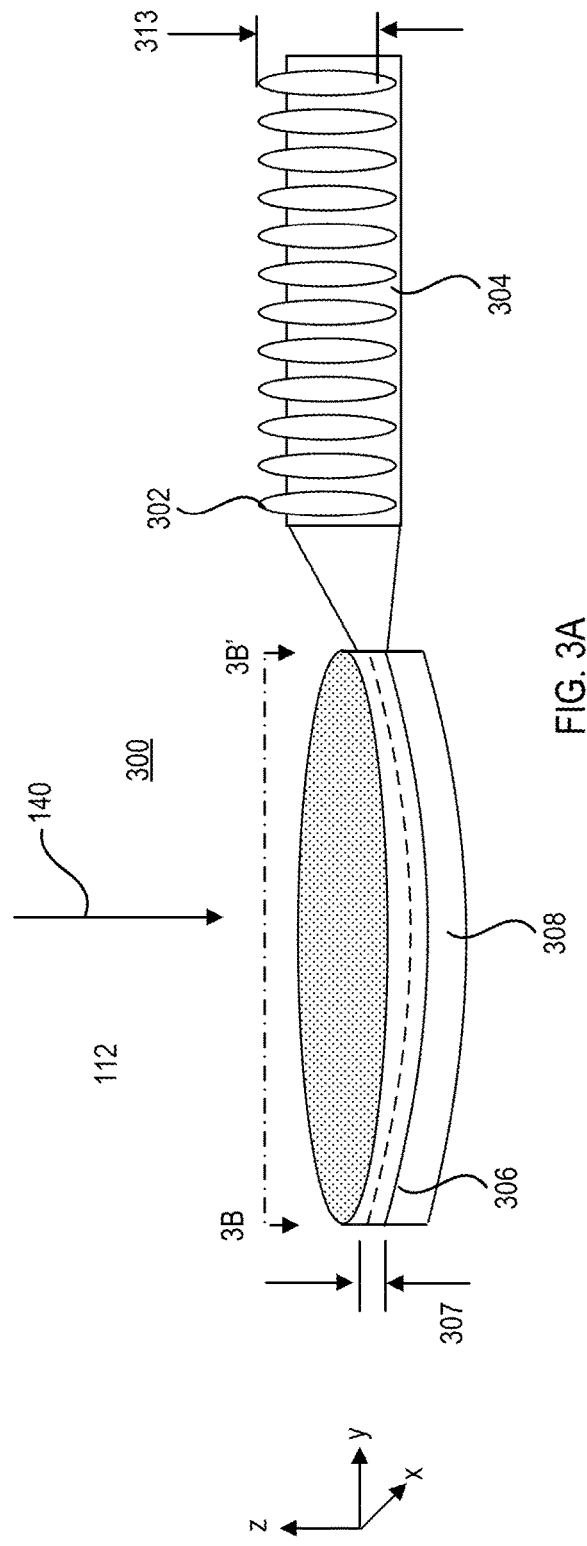

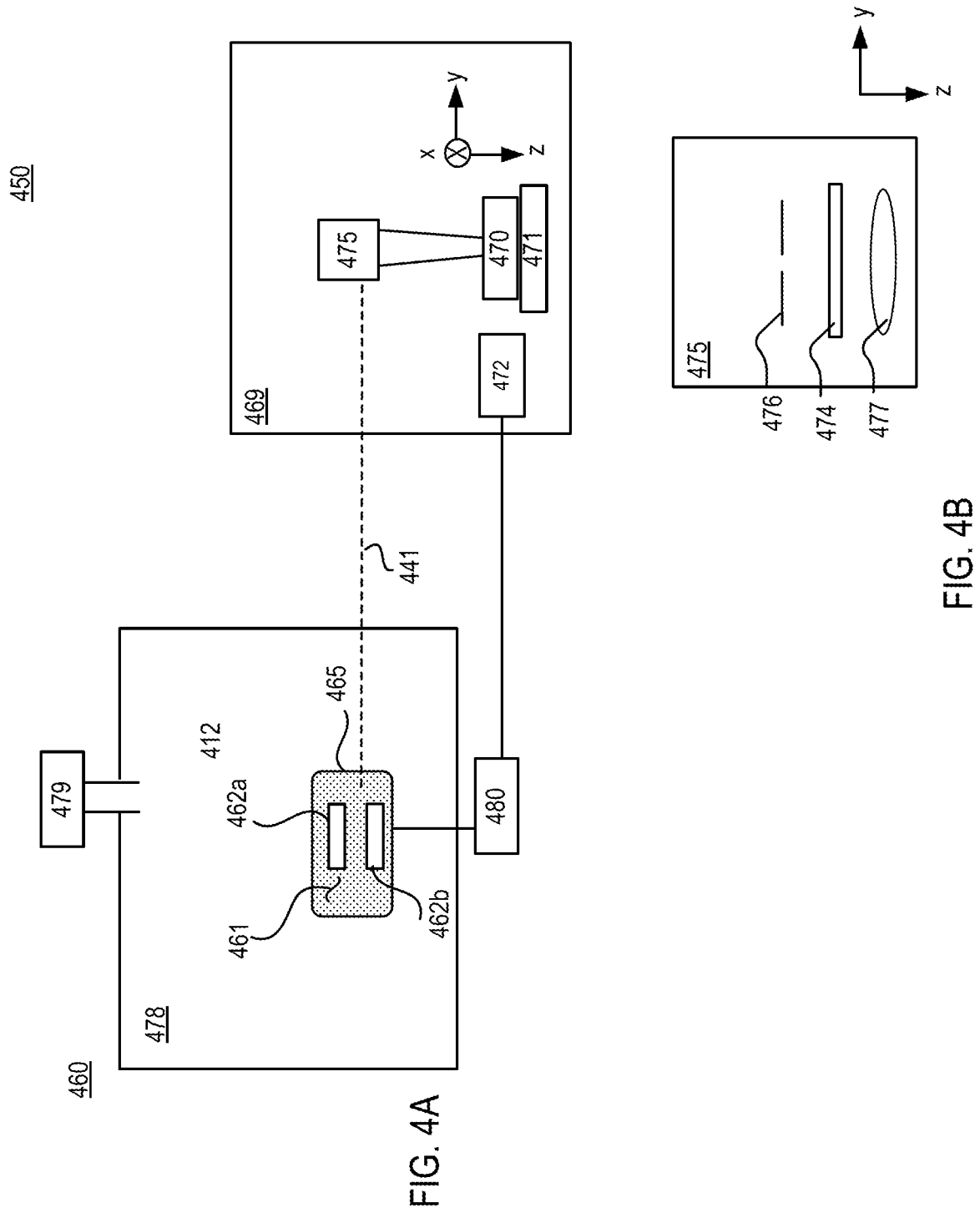

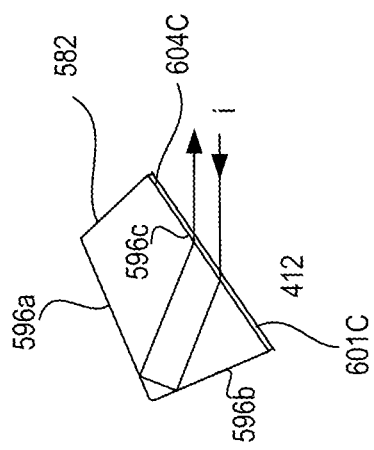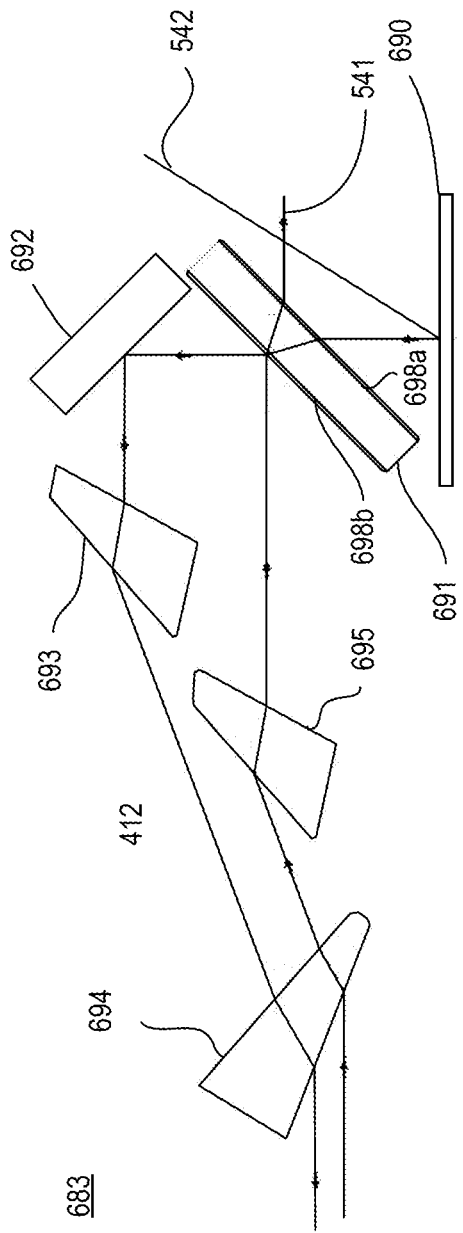
FIG. 6C
FIG. 6D

OPTICAL ELEMENT FOR A DEEP ULTRAVIOLET LIGHT SOURCE

CROSS REFERENCE TO RELATED APPLICATION

This application claims priority to U.S. Application No. 62/809,983, filed Feb. 25, 2019 and titled OPTICAL ELEMENT FOR A DEEP ULTRAVIOLET LIGHT SOURCE; and U.S. Application No. 62/835,646, filed Apr. 18, 2019 and titled OPTICAL ELEMENT FOR A DEEP ULTRAVIOLET LIGHT SOURCE, both of which are incorporated herein in their entirety by reference.

TECHNICAL FIELD

This disclosure relates to an optical element for a deep ultraviolet light (DUV) source.

BACKGROUND

Photolithography is the process by which semiconductor circuitry is patterned on a substrate such as a silicon wafer. A photolithography optical source provides the deep ultraviolet (DUV) light used to expose a photoresist on the wafer. One type of gas discharge light source used in photolithography is known as an excimer light source or laser. An excimer light source typically uses a gas mixture that is a combination of one or more noble gases, such as argon, krypton, or xenon, and a reactive species such as fluorine or chlorine. The excimer light source derives its name from the fact that under the appropriate condition of electrical stimulation (energy supplied) and high pressure (of the gas mixture), a pseudo-molecule called an excimer is created, which only exists in an energized state and gives rise to amplified light in the ultraviolet range. An excimer light source produces a light beam that has a wavelength in the deep ultraviolet (DUV) range and this light beam is used to pattern semiconductor substrates (or wafers) in a photolithography apparatus. The excimer light source can be built using a single gas discharge chamber or using a plurality of gas discharge chambers. The gas mixture in the gas discharge chamber may be exhausted from the gas discharge chamber or chambers.

SUMMARY

In one aspect, an optical element for a deep-ultraviolet light source includes a crystalline substrate; a coating on an exterior surface of the crystalline substrate, the coating having a thickness along a direction that extends away from the exterior surface; and a structure on and/or in the coating, the structure including a plurality of features that extend away from the crystalline substrate along the direction. The features include an amorphous dielectric material and are arranged such that an index of refraction of the structure varies along the direction.

Implementations may include one or more of the following features.

The crystalline substrate may include calcium fluoride ($CaF_2$). In some implementations, in operational use, deep-ultraviolet (DUV) light having a wavelength of 193 nanometers (nm) is incident on the coating, the coating protects the $CaF_2$ substrate by mitigating removal of fluorine from the substrate, and the index of refraction of the structure varies along a direction of propagation of the DUV light such that reflections of the DUV light from the optical element are reduced.

In some implementations, an extent of the features along the direction is no greater than the thickness. All of the features of the structure may be within the coating.

The features and the coating may be made of the same dielectric material.

One or more features may extend outside of the coating.

The amorphous dielectric material may include fused silica or alumina.

Each of the plurality of features may be the same, and the plurality of features may be arranged relative to each other in a regular and repeating pattern.

Each of the plurality of features may be the same, and the plurality of features may be arranged relative to each other in a random or pseudo-random manner.

Each of the plurality of features may be associated with spatial characteristics, and at least one spatial characteristic of one of the plurality of features is different from that spatial characteristic of at least one of the other features. The spatial characteristics may include any of height, width, and shape.

The index of refraction of the structure may vary linearly along the direction.

The index of refraction of the structure may vary along the direction from a value that is substantially equal to an index of refraction of the crystalline substrate to a value that is substantially equal to an index of refraction of a fluid at the optical element. The fluid may include a nitrogen ($N_2$) purge gas.

The features may have an extent along the direction of 100 nanometers (nm) or less.

The direction may be substantially orthogonal to a surface of the crystalline substrate.

The coating may completely cover a surface of the crystalline substrate.

In another aspect, a deep-ultraviolet (DUV) light source includes a chamber including a housing configured to enclose a gaseous gain medium, and at least one optical element configured to transmit DUV light. The at least one optical element includes: a substrate including a crystalline material configured to transmit DUV light; a coating on an exterior surface of the substrate, the coating having a thickness along a direction that extends away from the exterior surface; and a structure on and/or in the coating, the structure including a plurality of features that extend away from exterior surface along the direction. The features include an amorphous material and the features are arranged such that an index of refraction of the structure varies along the direction.

Implementations may include one or more of the following aspects.

One or more of the plurality of features may extend a distance along the direction, and the distance may be less than the wavelength of DUV light transmitted by the at least one optical element.

The plurality of features may be arranged relative to each other such that a spacing between any two adjacent features is within an order of magnitude of the wavelength of DUV light transmitted by the at least one optical element.

The crystalline material configured to transmit DUV light may include calcium fluoride ($CaF_2$).

The index of refraction of the structure may vary along the direction from a value that is substantially equal to an index of refraction of the crystalline substrate to a value that is substantially equal to an index of refraction of a fluid that surrounds the optical element. The fluid may include a nitrogen ($N_2$) purge gas.

The structure may be within the coating.

The structure may be in and on the coating, such that the structure is partially within the coating.

The chamber of the DUV light source also may include: a first window on a first side of the housing; and a second window on a second side of the housing, the second side of the housing being opposite the first side of the housing. The at least one optical element includes the first window and the second window, and the coating is on the first window and the second window. The coating on the first window and the coating on the second window may be disposed on surfaces of the respective windows that are exterior to the housing. In some implementations, the DUV light source also includes a second chamber, the second chamber including: a second housing configured to hold a gaseous gain medium in the interior of the second housing; a third window on a first side of the second housing; and a fourth window on a second side of the second housing, the second side of the second housing being opposite the first side of the second housing. The at least one optical element further includes the third window and the fourth window. The exterior surface of the first window and the exterior surface of the second window may be non-perpendicular to a direction of propagation of the DUV light.

The at least one optical element may include one or more of a prism, a beam splitter, a lens, and an optical compensator.

The index of refraction may vary along a direction of propagation of the DUV light.

In some implementations, in operational use, DUV light having a wavelength of 193 nanometers (nm) is incident on the coating, the coating protects the $CaF_2$ substrate by mitigating removal of fluorine from the substrate, and the index of refraction of the structure varies along a direction of propagation of the DUV light such that reflections of the DUV light from the optical element are reduced.

The coating may completely cover a surface of the crystalline substrate.

Implementations of any of the techniques described above and herein may include a process, an apparatus, and/or a method. The details of one or more implementations are set forth in the accompanying drawings and the description below. Other features will be apparent from the description and drawings, and from the claims.

BRIEF DESCRIPTION OF THE DRAWINGS

FIG. 1A is a perspective view of an optical element.

FIG. 1B is a side cross-sectional view of the optical element of FIG. 1A taken along line B-B' of FIG. 1A.

FIG. 3A is a perspective view of another optical element.

FIG. 3B is a cross-sectional view of the optical element of FIG. 3A taken along the line 3B-3B' of FIG. 3A.

FIG. 3C is a graph showing the index of refraction of the optical element structure as a function of position.

FIG. 4A is a block diagram of a photolithography system.

FIG. 4B is a block diagram of a projection optical system that may be used in the photolithography system of FIG. 4A.

FIG. 6C is a block diagram of beam turning element that may be used with the chamber of FIG. 6A.

FIG. 6D is a block diagram of a beam coupling optical system that may be used with the chamber of FIG. 6A.

DETAILED DESCRIPTION

Figure 1C:
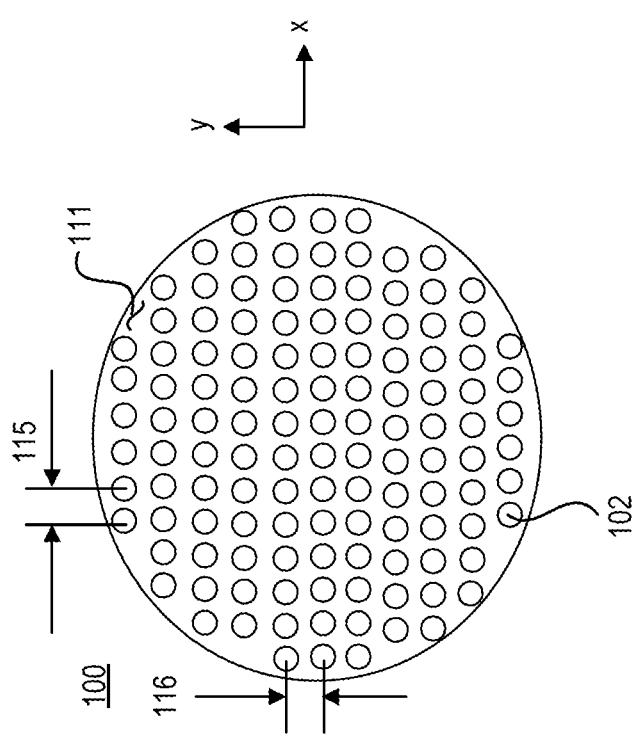
FIG. 1C is a view of the optical element of FIG. 1A in an x-y plane.
Figure 1D:
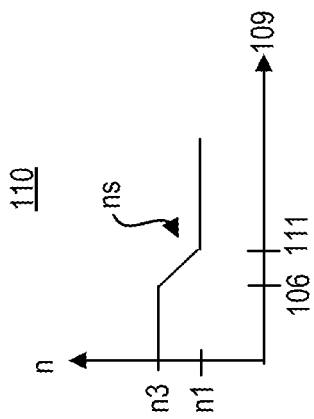
FIG. 1D shows an index of refraction of the optical element of FIG. 1A as a function of position.

Referring to FIGS. 1A-1C, an optical element 100 is shown. FIG. 1A is a perspective view of the optical element 100. FIG. 1B is a side cross-sectional view of the optical element 100 taken along line B-B' of FIG. 1A. FIG. 1C is a view of the optical element 100 in the x-y plane. FIG. 1D shows index of refraction of the optical element 100 as a function of position along the z direction.

The optical element 100 transmits a light beam 140. The light beam 140 includes wavelengths in the deep ultraviolet (DUV) range, and the optical element may be used in a DUV light source, such as the light source 460 shown in FIG. 4A or the light source 560 shown in FIG. 5. The DUV range includes wavelengths from 10 nanometers (nm) to 400 nm. In other implementations, the optical element 100 may be used in various other optical systems and in conjunction with various other light sources.

In the implementation illustrated in FIGS. 1A-1C, the optical element 100 includes a structure 101 that is shown as being disposed within a coating 104. However, in various implementations, the structure 101 may be partially or completely within the coating 104 or it may be on the coating 104 such as on the surface 111 of the coating 104. As discussed below, the structure 101 provides a gradient index of refraction and reduces fresnel reflection losses. Fresnel reflection losses (or reflection losses) are losses incurred at input and output interfaces of a component in an optical system due to the difference between the index of refraction of the component and the index of refraction of the medium or mediums at the input and output interfaces. The coating 104 is a protective coating that extends outward from a surface 106 along a direction 109. The surface 106 is an exterior surface of a crystalline substrate 108. The coating 104 is attached to an exterior surface 106 of the crystalline substrate 108. The coating 104 may be attached to the exterior surface 106 in a manner that allows the coating 104 to be removed from the exterior surface 106. The coating 104 may cover the entire surface 106. The coating 104 has a thickness 107 along the direction 109. In the example of FIGS. 1A-1C, the direction 109 is parallel to the z direction.

The crystalline substrate 108 is a crystalline material, such as calcium fluoride ($CaF_2$) or magnesium fluoride ($MgF_2$), that transmits light in the DUV range. A crystalline material is a solid material whose constituents (such as atoms or ions) are arranged in a highly ordered microscopic structure that forms a crystal lattice that extends along the crystalline axes.

The coating 104 prevents or minimizes surface degradation of the crystalline substrate 108 during operational use (for example, when the light beam 140 interacts with the optical element 100). For example, in implementations in which the light beam 140 has a wavelength of 193 nm and the crystalline substrate 108 is $CaF_2$, the light beam 140 causes depletion of the fluorine in the crystalline substrate 108. In these implementations, the coating 104 protects the crystalline substrate 108 by acting as a seal or barrier that prevents fluorine from escaping when the light beam 140 is incident on the crystalline substrate 108. Thus, the coating 104 enables the optical element 100 to be used effectively in a DUV light source.

The coating 104 is designed in a way to match the refractive index n3 of the crystalline substrate 108, that is, the coating 104 has the same refractive index n3 as that of the crystalline material 108 or a refractive index very similar to the refractive index n3. However, the index of refraction n3 of the crystalline substrate 108 and an index of refraction n1 of a medium 112 at an outer surface 111 of the coating 104 are different. Thus, in a traditional optical element (that lacks the structure 101) fresnel reflection losses arise at the outer surface 111 (and additional, minimal losses may arise at the surface 106). The fresnel reflection losses may be, for example, about 4.00-5% of the incident optical power at the surface 111 for implementations in which n1=1 and n3=1.5018 and a normal angle of incidence for the s and p-polarization components of the light beam 140. The fresnel reflection losses reduce the amount of optical power that the light beam 140 is able to provide to a downstream optical tool (such as the lithography exposure apparatus 469 of FIG. 4A). Moreover, the reflection losses may cause various components of a DUV light source to work beyond their efficient and/or optimal operating level in an attempt to make up for the reflection losses. This may lead to inefficient operation, a degradation in performance, and/or reduced lifetime of components in the DUV light source.

On the other hand, the optical element 100 includes the structure 101, which reduces or eliminates these fresnel losses by providing a gradient or variable index along the direction 109. Referring also to FIG. 1D, the optical element 100 has an index of refraction profile 110, which is the index of refraction as a function of position along the direction 109. The index of refraction of the structure 101 is represented as ns. The index of refraction ns is not constant along the direction 109 but instead varies along the direction 109 from the index of refraction n3 at the surface 106 to the index of refraction n1 at an outer surface 111 of the optical element 100. In the example of FIG. 1B, the index of refraction ns varies linearly along the direction 109. In other implementations, the index of refraction ns may vary in other manners along the direction 109.

A structure such as the structure 101 with the features 102 generally cannot be formed directly on or within a crystalline material. Thus, the structure 101 is formed on, partially within, or completely within the coating 104, which is an amorphous dielectric material. As such, in the optical element 100, the coating 104 performs both a protective function by protecting the substrate 108 from optical degradation and a reflection-reduction or elimination function due to the structure 101.

The structure 101 achieves the gradient index of refraction by an intentional arrangement of features 102. The features 102 are shown in the y-z plane in the inset of FIG. 1A. The features 102 extend along the direction 109 and are arranged in a pattern as shown in FIG. 1C, although features 102 may be arranged differently in other implementations. In FIG. 1B, the structure 101 is represented as a region with dotted shading. For simplicity, only one of the features 102 is labeled in FIGS. 1A and 1C.

The features 102 are arranged in the pattern such that an index of refraction of the structure 101 varies or is non-constant. For example, when the dimensions of the features 102 in the x, y, and/or z directions are small compared to the wavelength of the light beam 140, the features 102 present a variable and gradually changing index of refraction ns along the direction of propagation of the light beam 140. By varying the index of refraction, fresnel reflection losses incurred when the light beam 140 interacts with the optical element 100 are reduced.

Furthermore, the structure 101 is suitable for use with light in the DUV light range. One typical approach to reducing fresnel reflection losses at the interfaces of an optical element is to place an anti-reflection (AR) coating on the interfaces. An AR coating often is formed from a stack of dielectric materials with different indices of refraction and also may be referred to as a multi-layered dielectric stack or a Bragg mirror. However, these types of AR coatings are generally not suitable for use in the DUV light range and/or have shorter than typical lifespans than the coating 104 due to deterioration of the AR coating materials by the relatively high photon energy of DUV light. For example, AR coatings for use at 193 nm for AR stacks may include fluorides such as lanthanum trifluoride ($LaF_3$), gadolinium fluoride ($GdF_3$), aluminum fluoride ($AlF_3$), cerium(III) fluoride ($CeF_3$), lithium fluoride (LiF), and magnesium fluoride ($MgF_2$). However, these materials tend to form porous structures when deposited, and attempts to densify the coatings for robustness at 193 nm increase their absorption at 193 nm. The uncorrectable porosity contributes to shorter lifetimes. Moreover, densified versions of these materials tend to have unacceptable thermal absorption and coating stress issues, which may result in deterioration (for example, blistering and delamination). Furthermore, dielectric coating stacks may generally suffer from manufacturing variability, and this may result in inconsistent lifetime performance.

On the other hand, the structure 101 is formed from the same material, or the same type of material as the coating 104 or from a similar amorphous dielectric and is thus will generally have a lifetime on the order of that for coating 104.

The coating 104 and the features 102 are made of an amorphous dielectric solid material that transmits light in the DUV range. An amorphous solid material is a solid material that lacks the long-range order that is characteristic of a crystalline material. The coating 104 and the features 102 may be made of, for example, glass, fused silica, borosilicate glass, plastic, silicon, or alumina. The coating 104 and the features 102 may be made of the same amorphous dielectric material or from different dielectric materials.

Each of the features 102 has a shape that is unchanging after the formation of the optical element 100. The shape of a feature defines the volume in space occupied by that feature. In some implementations, all of the features have the same shape. In other implementations, the shapes of the features 102 vary (for example, are semi-random) and are not all the same. The features 102 are represented as elliptically shaped in FIGS. 1A and 1C. However, the features 102 may have other shapes. For example, the features 102 may be cone shaped with the widest part of the cone being closest to the surface 106.

In the example of FIGS. 1A-1C, the structure 101 is shown as being completely within the coating 104. In other words, none of the features 102 extend in the z direction beyond the outer surface 111. The features 102 may be formed into the coating 104 using, for example, a dry or wet etching procedure or a chemical etching procedure.

The structure may be coextensive with the coating 104. For example, an extent 113 of the features 102 along the z direction may be the same as a thickness 107 of the coating 104. The extent 113 is shown in the inset of FIG. 1A. In some implementations, the extent 113 is less than the thickness 107 of the coating 104. Moreover, in some implementations, the extent 113 is greater than the thickness 107 such that the structure 101 is partially within the coating 104 or on and in the coating 104.

Referring to FIG. 1C, the features have a center-to-center spacing 115 in the x direction and a center-to-center spacing 116 in the y direction. The spacings 115, 116 represent the distance between two neighboring features 102. The features 102 may be arranged in a rectilinear grid. In these implementations, the spacing 115 and the spacing 116 is uniform throughout the structure 101 such that all of the features are separated from the nearest feature by the same spacing 116 in the y direction and the same spacing 115 in the x direction. Moreover, the spacing 116 and the spacing 115 may be the same. In other implementations, features 102 are arranged in a random or pseudo-random fashion. In these implementations, the spacing 115 and the spacing 116 are non-uniform and the distance between any two neighboring features 102 varies throughout the structure 101.

The extent 113 may be less than the wavelength of the light beam 140, and the spacings 115, 116 may be on the order of the wavelength of the light beam 140. For example, in implementations in which the wavelength of the light beam 140 is 193 nm, the extent 113 may be between 30 and 50 nm, and the spacing 115, 116 may be between 100 and 200 nm. The structure 101 may be a nanostructure, which is a structure that has components (such as the features 102) that have dimensions that are no more than a few hundred nanometers (nm) in spatial extent.

In the example of FIGS. 1A-1C, the light beam 140 propagates in the medium 112 in the −z direction (into the page in FIG. 1C). The light beam 140 impinges on the outer surface 111 of the optical element 100. Due to the structure 101, the difference between the index of refraction n1 of the medium 112 and the index of refraction ns of the coating 104 at the outer surface 111 is reduced or eliminated, and the difference, if any, between the index of refraction n2 and the index of refraction n1 at the surface 106 has been reduced or eliminated.

Figure 2C:
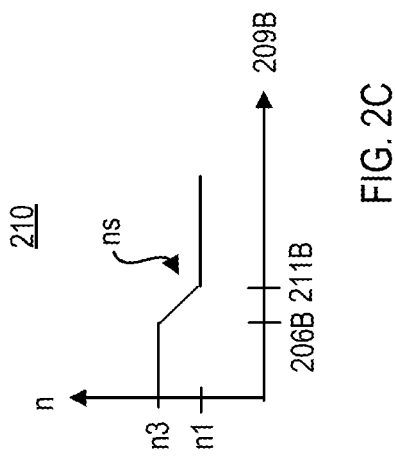
FIG. 2C shows an index of refraction of the optical element of FIG. 2B as a function of position.
Figure 2A:
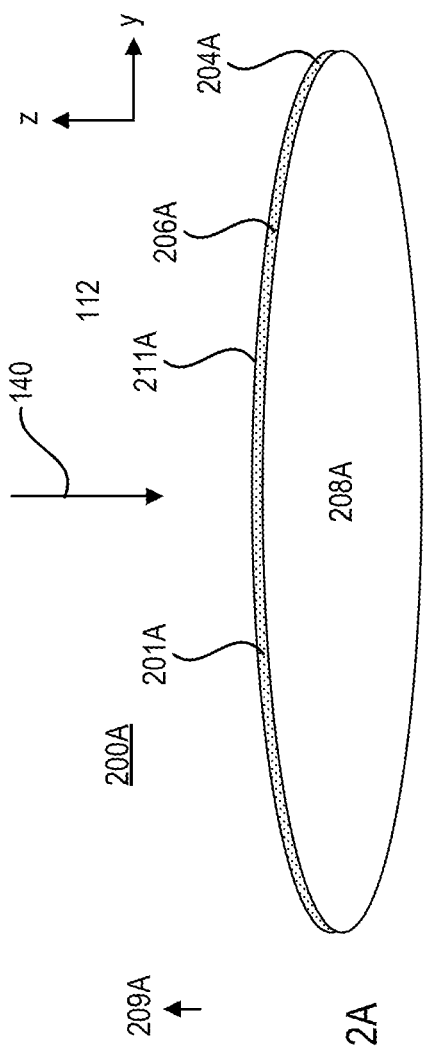
FIGS. 2A and 2B show cross-sectional views of other optical elements.

In the optical element 100 shown in FIGS. 1A-1C, the surfaces 106, 111 are substantially flat in the x-y plane and the crystalline substrate 108 and the coating 104 are plate-like structures. The optical element 100 may be used as a window, for example. The substrate 108 and the coating 104 may have different shapes, such as shown in FIG. 2A. Moreover, the optical element 100 may be oriented at an angle relative to the direction of propagation of the light beam 140, such as shown in FIG. 2B.

Figure 2B:
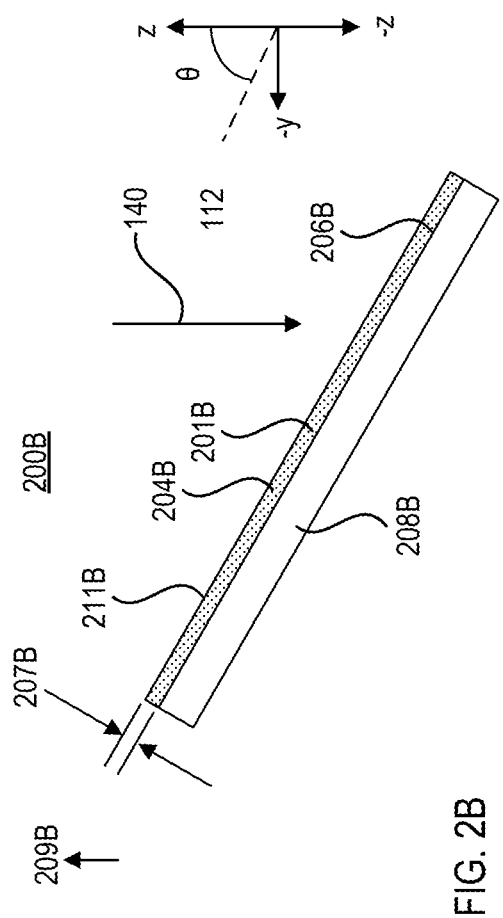

FIGS. 2A and 2B show cross-sectional views of optical elements 200A and 200B, respectively. The optical elements 200A and 200B are examples of other implementations of the optical element 100. The cross-sectional views of the optical elements 200A and 200B are in the y-z plane.

The optical element 200A includes a coating 204A that extends radially outward along a direction 209A from a surface 206A of a crystalline substrate 208A. A structure 201A (represented by the dotted shading) is within the coating 204A. Although the structure 201A is within the coating 204A, in other implementations the structure 201A may be on the coating 204A or partially within the coating 204A. The structure 201A is similar to the structure 101 discussed with respect to FIGS. 1A-1D. The structure 201A is within the coating 204A. The structure 201A has an index of refraction that varies along the direction 209A to thus reduce fresnel reflection losses of the light beam 140. In the implementation of FIG. 2A, the structure 201A includes features that extend normal to the surface 206A. The surface 206A is curved, as such not all of the features extend in the same direction.

Referring to FIG. 2B, the optical element 200B includes a crystalline substrate 208B and a coating 204B that extends outward from a surface 206B of the crystalline substrate 208B. The coating 204B has a thickness 207B along a direction that is normal to the surface 206B. The optical element 200B is similar to the optical element 100 in shape. However, the optical element 200B is intended to be positioned at an angle θ relative to the direction of propagation (z) of the incident light beam 140. A structure 201E (shown with dotted shading) is within the coating 204B. The structure 202B includes features 201B, which are similar to the features 102 discussed above with respect to FIGS. 1A-1D. The features in the structure 201B are arranged such that the index of refraction ns of the structure 201B varies along a direction 209B. For example, the features 201B may extend normal to the surface 206B and the index of refraction ns of the structure 201B may have a profile 210 that varies along the direction 209B as shown in FIG. 2C. The direction 209B is parallel but opposite to the direction of propagation of the light beam 140. Thus, the index of refraction of the structure 201B varies along of propagation of the light beam 140 even though the optical element 200B is positioned at the angle θ relative to the direction of propagation of the beam 140.

Referring to FIGS. 3A and 3B, another implementation of the optical element 100 is shown. FIG. 3A is a perspective view of an optical element 300. FIG. 3B is a cross-sectional view of the optical element 300 taken along the line 3B-3B' of FIG. 3A.

The optical element 300 includes a crystalline substrate 308 and a protective coating 304 that is attached to a surface 306 (for example, coated on the surface 306) of the crystalline substrate 308. The crystalline substrate 308 is a crystalline material that transmits DUV light. The protective coating 304 is an amorphous dielectric material that extends in a direction 309 from the surface 306. The protective coating 304 has a thickness 307 along the direction 309. The thickness 307 is the distance from the surface 306 to an end 319 of the coating 304. The end 319 is depicted with a dashed line style in FIG. 3B.

The optical element 300 also includes a structure 301 that includes features 302. The features 302 are made of an amorphous dielectric material that may be the same or different than the amorphous dielectric material used for the protective coating 304. Like the features 201 on the structure 101, the features 302 are arranged such that an index of refraction ns of the structure 301 varies along the direction 309. The direction 309 is parallel to and opposite from the direction of propagation of the light beam 140. Thus, the index of refraction ns also varies along the direction of propagation of the light beam 140. FIG. 3C shows a profile 310, which represents the index of refraction of the structure 301 as a function of position along the direction 309.

The features 302 extend along the direction 309 outside of the coating 304. In the example shown in FIGS. 3A and 3B, the features 302 extend in the direction 309 beyond the end 319 of the protective coating 304, and an extent 313 of the features 302 in the direction 309 is greater than the thickness 307 of the coating 304. The features 302 may be formed by lithographic etching or by building the features 302 on the coating 304. For example, the features 302 may be built by a chemical etching process, for example, dry gas etching, followed by the deposition of the protective coating 304 on top of the features 302.

In other implementations, features 302 and coating 304 may be used in conjunction with various other optical elements.

Figure 5:
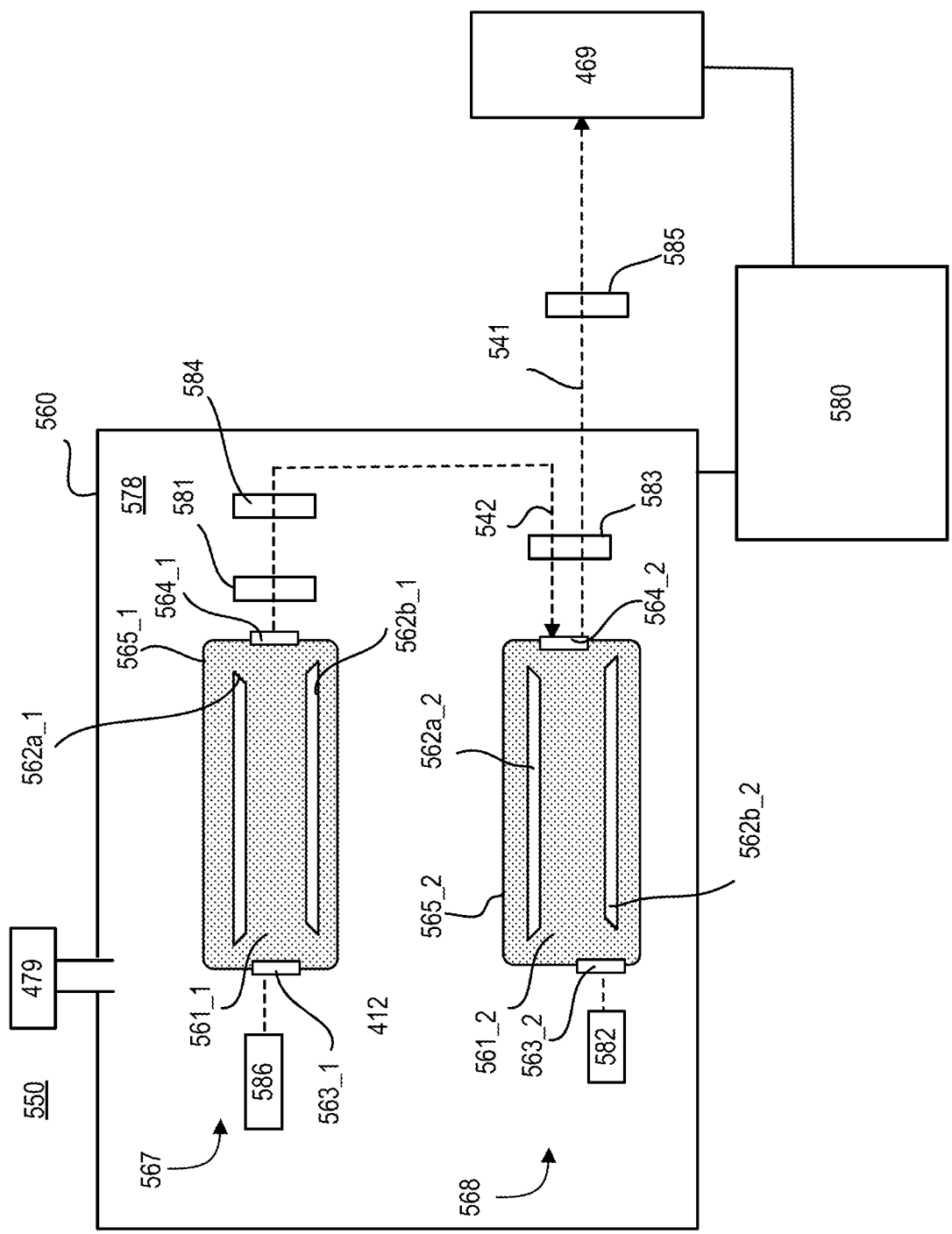
FIG. 5 is a block diagram of another photolithography system.

FIGS. 4A and 5 provide examples of DUV light sources 460 and 560, respectively, that may use the optical element 100, 200A, 200B, and/or 300.

Referring to FIGS. 4A and 4B, a photolithography system 450 includes the DUV light source 460 that provides a light beam 441 to a lithography exposure apparatus 469, which processes a wafer 470 received by a wafer holder or stage 471. The DUV light source 460 includes a discharge chamber 465, which encloses a gain medium 461, a cathode 462a, and an anode 462b. The gain medium 461 is a gaseous gain medium. The discharge chamber 465 is sealed such that the gain medium 461 remains in and is contained by the discharge chamber 465. Only one gas discharge chamber 465 is shown in FIG. 4A. However, the light source 460 may include more than one discharge chamber, such as shown in FIG. 5.

The DUV light source 460 also includes a gas management system 479. The gas management system 479 is in fluid communication with an interior 478 of the DUV light source 460. The gas management system 479 may include devices that manage the pressure and/or the fluid substances in the interior 478. For example, the gas management system 479 may include pumps, fans, filters, and/or other devices capable of managing gases and debris. The gas management system 479 may remove unwanted chemical substances, elements, or mixtures from the interior 478. For example, the gas management system 479 may purge out oxygen from the interior 478 using another chemical (in the form of a gas) such as, for example, nitrogen ($N_2$) or helium (He). The gas used by the gas management system 479 to remove the unwanted substances is referred to as a purge gas 412. Although the purge gas 412 is in the interior 478 and may surround the discharge chamber 465, the purge gas 412 does not penetrate the discharge chamber 465 and does not disturb or change the chemical composition of the gain medium 461. The light beam 441 propagates in the interior 478 and thus propagates in the purge gas 412.

The light beam 441 may be a pulsed light beam that includes pulses of light separated from each other in time. The lithography exposure apparatus 469 includes a projection optical system 475 through which the light beam 441 passes prior to reaching the wafer 470, and a metrology system 472. The metrology system 472 may include, for example, a camera or other device that is able to capture an image of the wafer 470 and/or the light beam 441 at the wafer 470, or an optical detector that is able to capture data that describes characteristics of the light beam 441, such as intensity of the light beam 441 at the wafer 470 in the x-y plane. The lithography exposure apparatus 469 may be a liquid immersion system or a dry system. The photolithography system 450 also includes a control system 480 to control the light source 460 and/or the lithography exposure apparatus 469.

Microelectronic features are formed on the wafer 470 by, for example, exposing a layer of radiation-sensitive photoresist material on the wafer 470 with the light beam 441. Referring also to FIG. 4B, the projection optical system 475 includes a slit 476, a mask 474, and a projection objective, which includes a lens system 477. The lens system 477 includes one or more reflective or refractive optical elements that are capable of interacting with light in the DUV range. The light beam 441 enters the optical system 475 and impinges on the slit 476, and at least some of the beam 441 passes through the slit 476. In the example of FIGS. 4A and 4B, the slit 476 is rectangular and shapes the light beam 441 into an elongated rectangular shaped light beam. The mask 474 includes a pattern, and this pattern determines which portions of the shaped light beam are transmitted by the mask 474 and which are blocked by the mask 474. The design of the pattern is determined by the specific microelectronic circuit design that is to be formed on the wafer 470.

Referring to FIG. 5, a block diagram of a photolithography system 550 is shown. The system 550 is an example of an implementation of the system 450 (FIG. 4A). For example, in the photolithography system 550, a light source 560 is used as the light source 460 (FIG. 4A). The light source 560 produces a pulsed light beam 541, which is provided to the lithography exposure apparatus 469. The photolithography system 550 also includes a control system 580, which, in the example of FIG. 5, is connected to components of the optical source 560 as well as to the lithography exposure apparatus 469 to control various operations of the system 550. In other implementations, the control system 580 may be implemented as two separate control systems, one to control various aspects of the light source 560 and another to control the lithography exposure apparatus 469. In still other implementations, various other control systems 580 may be implemented.

In the example shown in FIG. 5, the light source 560 is a two-stage laser system that includes a master oscillator (MO) 567 that provides a seed light beam 542 to a power amplifier (PA) 568. The MO 567 and the PA 568 may be considered to be subsystems of the light source 560 or systems that are part of the light source 560. The PA 568 receives the seed light beam 542 from the MO 567 and amplifies the seed light beam 542 to generate the light beam 541 for use in the lithography exposure apparatus 469. For example, in some implementations, the MO 567 may emit a pulsed seed light beam, with seed pulse energies of approximately 1 milliJoule (mJ) per pulse, and these seed pulses may be amplified by the PA 568 to about 10 to 15 mJ.

The MO 567 includes a discharge chamber 565_1 having two elongated electrodes 562a_1 and 562b_1, a gain medium 561_1 that is a gas mixture, and a fan (not shown) for circulating the gas mixture between the electrodes 562a_1, 562b_1. A resonator is formed between a line narrowing module 586 on one side of the discharge chamber 565_1 and an output coupler 581 on a second side of the discharge chamber 565_1.

The discharge chamber 565_1 includes a first chamber window 563_1 and a second chamber window 564_1. The first and second chamber windows 563_1 and 564_1 are on opposite sides of the discharge chamber 565_1. The first and second chamber windows 563_1 and 564_1 transmit light in the DUV range and allow DUV light to enter and exit the discharge chamber 565_1.

The line narrowing module 586 may include a diffractive optic such as a grating that finely tunes the spectral output of the discharge chamber 565_1. The light source 560 also includes a line center analysis module 584 that receives an output light beam from the output coupler 581 and a beam coupling optical system 583. The line center analysis module 584 is a measurement system that may be used to measure or monitor the wavelength of the seed light beam 542. The line center analysis module 584 may be placed at other locations in the light source 560, or it may be placed at the output of the light source 560.

The gas mixture that is the gain medium 561_1 may be any gas suitable for producing a light beam at the wavelength and bandwidth required for the application. For an excimer source, the gas mixture 561_1 may contain a noble gas (rare gas) such as, for example, argon or krypton, a halogen, such as, for example, fluorine or chlorine and traces of xenon apart from a buffer gas, such as helium. Specific examples of the gas mixture include argon fluoride (ArF), which emits light at a wavelength of about 193 nm, krypton fluoride (KrF), which emits light at a wavelength of about 248 nm, or xenon chloride (XeCl), which emits light at a wavelength of about 351 nm. Thus, the light beams 541 and 542 include wavelengths in the DUV range in this implementation. The excimer gain medium (the gas mixture) is pumped with short (for example, nanosecond) current pulses in a high-voltage electric discharge by application of a voltage to the elongated electrodes 562$a$_1, 562$b$_1.

The PA 568 includes a beam coupling optical system 583 that receives the seed light beam 542 from the MO 567 and directs the seed light beam 542 through a discharge chamber 565_2, and to a beam turning optical element 582, which modifies or changes the direction of the seed light beam 542 so that it is sent back into the discharge chamber 565_2. The beam turning optical element 582 and the beam coupling optical system 583 form a circulating and closed loop optical path in which the input into a ring amplifier intersects the output of the ring amplifier at the beam coupling optical system 583.

The discharge chamber 565_2 includes a pair of elongated electrodes 562$a$_2, 562$b$_2, a gain medium 561_2, and a fan (not shown) for circulating the gain medium 561_2 between the electrodes 562$a$_2, 562$b$_2. The gas mixture that forms the gain medium 561_2 may be the same as the gas mixture that forms gain medium 561_1.

The discharge chamber 565_2 includes a first chamber window 563_2 and a second chamber window 564_2. The first and second chamber windows 563_2 and 564_2 are on opposite sides of the discharge chamber 565_2. The first and second chamber windows 563_2 and 564_2 transmit light in the DUV range and allow DUV light to enter and exit the discharge chamber 565_2.

The output light beam 541 may be directed through a beam preparation system 585 prior to reaching the lithography exposure apparatus 469. The beam preparation system 585 may include a bandwidth analysis module that measures various parameters (such as the bandwidth or the wavelength) of the beam 541. The beam preparation system 585 also may include a pulse stretcher (not shown) that stretches each pulse of the output light beam 541 in time. The beam preparation system 585 also may include other components that are able to act upon the beam 541 such as, for example, reflective and/or refractive optical elements (such as, for example, lenses and mirrors), filters, and optical apertures (including automated shutters).

The DUV light source 560 also includes the gas management system 479, which is in fluid communication with an interior 578 of the DUV light source 560. As discussed above, the gas management system 479 provides the purge gas 412 to the interior 578. In the example of FIG. 5, the purge gas 412 surrounds the chambers 565_1 and 565_2 and also surrounds optical components of some of the subsystems of the DUV light source 560. For example, the purge gas 412 surrounds the optical components in the line narrowing module 586, output coupler 581, the line center analysis module 584, the beam coupling optical system 583, and the beam turning optical element 582. Although the purge gas 412 is in the interior 578 and surrounds the discharge chambers 565_1 and 565_2 and various other optical components, the purge gas 412 does not penetrate the discharge chambers 565_1 and 565_2 and does not disturb or change the chemical composition of the gain mediums 561_1 and 561_2.

The photolithography system 550 also includes the control system 580. The control system 580 may control when the light source 560 emits a pulse of light or a burst of light pulses that includes one or more pulses of light by sending one or more signals to the light source 560. The control system 580 is also connected to the lithography exposure apparatus 469. Thus, the control system 580 also may control the various aspects of the lithography exposure apparatus 469. For example, the control system 580 may control the exposure of the wafer 470 (FIG. 4A) and thus may be used to control how electronic features are printed on the wafer 470. In some implementations, the control system 580 may control the scanning of the wafer 470 by controlling the motion of the slit 476 in the x-y plane (FIG. 4B). Moreover, the control system 580 may exchange data with the metrology system 472 and/or the optical system 475 (FIG. 4B).

The lithography exposure apparatus 469 also may include, for example, temperature control devices (such as air conditioning devices and/or heating devices), and/or power supplies for the various electrical components. The control system 580 also may control these components. In some implementations, the control system 580 is implemented to include more than one sub-control system, with at least one sub-control system (a lithography controller) dedicated to controlling aspects of the lithography exposure apparatus 469. In these implementations, the control system 580 may be used to control aspects of the lithography exposure apparatus 469 instead of, or in addition to, using the lithography controller.

When the gain medium 561_1 or 561_2 is pumped by applying voltage to the electrodes 562$a$_1, 562$b$_1 or 562$a$_2, 562$b$_2, respectively, the gain medium 561_1 and/or 561_2 emits light. When voltage is applied to the electrodes at regular temporal intervals, the light beam 541 is pulsed. Thus, the repetition rate of the pulsed light beam 541 is determined by the rate at which voltage is applied to the electrodes. The repetition rate of the pulses may range between about 500 and 6,000 Hz for various applications. In some implementations, the repetition rate may be greater than 6,000 Hz, and may be, for example, 12,000 Hz or greater, but other repetition rates may be used in other implementations.

The optical elements 100, 200A, 200B, and/or 300 may be used in the light source 460 or the light source 560 to reduce fresnel reflection losses. For example, any or all of the chamber windows 563_1, 564_1, 563_2, 564_2 may be formed of an optical element similar to the optical element 200B (FIG. 2B). Moreover, any or all of the optical components used as the beam turning optical element 582, the beam coupling optical system 583, the line center analysis module 584, the output coupler 581, and the line narrowing module 586 may include a structure that includes features (such as the structure 101 that includes the features 102) that produces a gradient index of refraction to reduce Fresnel reflections.

In various other implementations, the optical elements 100, 200A, 200B, and/or 300 may be used in various other suitable light sources and in conjunction with various other photolithography systems.

Figure 6A:
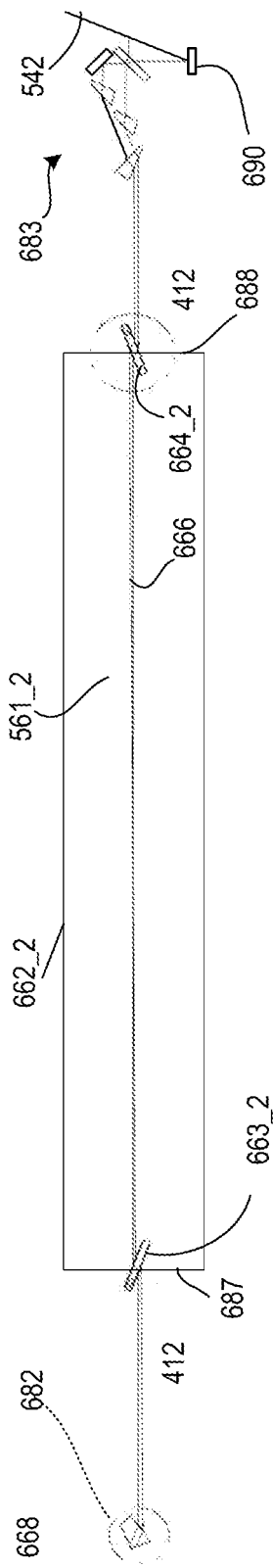
FIG. 6A is a block diagram of a power amplifier (PA) for a deep ultraviolet (DUV) light source.

FIG. 6A is a block diagram of a PA 668. The PA 668 is an example of an implementation of the PA 568 (FIG. 5). The PA 668 may be used in the DUV light source 560 (FIG. 5) in place of the PA 568. The PA 668 includes a discharge chamber 662_2, a beam turning optical element 682, and a beam coupling optical system 683. The beam coupling optical system 683 is shown in more detail in FIG. 6D.

The discharge chamber 662_2 encloses the gain medium 561_2 (FIG. 5). The discharge chamber 662_2 includes a first chamber window 663_2 and a second chamber window 664_2. The first chamber window 663_2 and the second chamber window 664_2 allow DUV light to enter and exit the discharge chamber 662_2. DUV light enters the second chamber window 664_2 and propagates on a path 666 through the gain medium 561_2 and exits through the first chamber window 663_2.

Figure 6B:
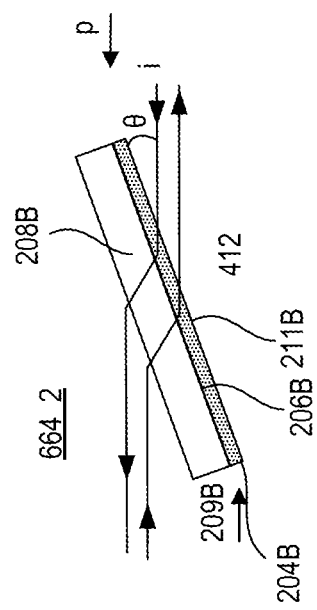
FIG. 6B is a block diagram of a window that may be used in the chamber of FIG. 6A.

In the example shown, the first chamber window 663_2 is on a left wall 687 of the discharge chamber 662_2 and the second chamber window 664_2 is on a right wall 688 of the discharge chamber 662_2. The walls 687 and 688 extend parallel to each other and are on opposite sides of the discharge chamber 662_2. Other implementations and other relative orientations of the windows 663_2, 664_2 are possible. The windows 663_2, 664_2 are angled at an angle θ relative to a direction of propagation of an intermediate light beam i. The angle θ is shown in FIG. 6B.

Referring also to FIG. 6D, the beam coupling optical system 683 receives the seed light beam 542 at a folding mirror 690, which reflects the seed light beam 542 to a partially reflective mirror 691 (also referred to as an input/output coupler 691). The input/output coupler 691 is the entrance to and exit from a ring resonator formed by the beam coupling optical system 683 and the beam turning optical element 682.

The input/output coupler 691 has a surface 698a that transmits DUV light and a surface 698b that is partially reflective, for example, 20% to 40% reflective to DUV light, such that at least part of the seed light beam 542 passes through the input/output coupler 691 and at least some of the light impinging upon the surface 698b of the input/output coupler 691 is reflected back to the discharge chamber 662_2, providing regenerative feedback. Other degrees of reflectivity may be used in other implementations. The light that is reflected back to the discharge chamber 662_2 and the portion of the seed light beam 542 that passes through the input/output coupler 691 is referred to as an intermediate beam i in the discussion below.

The intermediate light beam i passes through the prisms 693 and 694. Together, the prisms 693 and 694 form a beam compression system that compresses the intermediate light beam i horizontally to substantially match the transverse size of the gain medium 561_2, which may be, for example, less than a few millimeters (mm). The prism 694 aligns the intermediate light beam i with the second chamber window 664_2, the first chamber window 663_2, and the beam turning optical element 682. The intermediate light beam i passes through the prism 694 and the second chamber window 664_2, propagates on a path 666 through the gain medium 561_2, and is reflected by the beam turning optical element 682. The intermediate light beam i re-enters the chamber 662_2 through the first chamber window 663_2, propagates through the gain medium 561_2 and passes through the second chamber window 664_2, and then through the prism 694, which shifts the beam to a prism 695, which shifts the intermediate light beam i to the input/output coupler 691.

The first chamber window 663_2 and/or the second chamber window 664_2 may be implemented as the optical element 200B (FIG. 2B). FIG. 6B shows the second chamber window 664_2 implemented with the features of the optical element 200B. In this implementation, the second chamber window 664_2 includes the protective coating 204B, which extends outward from a surface 206B of the crystalline substrate 208B. The structure 201B (shown with dotted shading) is in or on the protective coating 204B to reduce fresnel reflections. The structure 201B has an index of refraction ns that varies along the direction 209B, which is parallel and opposite to the direction p. Thus, the index of refraction ns varies along the direction of propagation of the intermediate light beam i. FIG. 2C shows the index of refraction ns as a function of position along the 209B direction. In the example of the optical element 200B being the second chamber window 664_2, n1 is the index of refraction of the purge gas 412 and n3 is the index of refraction of the crystalline substrate 208B.

Referring again to FIG. 6B, the intermediate light beam i propagates in the p direction through the purge gas 412. The intermediate light beam i is incident on the surface 211B and passes through the structure 201B and through the crystalline substrate 208B. Although the index of refraction of the protective coating 204B is different from the index of refraction of the purge gas 412, the gradient index of refraction in the structure 201B reduces or eliminates fresnel reflection losses that would otherwise occur at the surface 211B. By reducing the fresnel reflection losses, more of the intermediate light beam i is available for amplification without having the increase the amount of energy supplied to the electrodes 562a_2 and 562b_2. Thus, using the optical element 200B as the chamber window 663_2 and/or 664_2 increases the lifetime of the chamber 665_2.

Moreover, the use of optical elements that include a structure such as the structure 101, 201A, 201B, or 301 benefits the overall DUV light source 550 by lowering the total energy that passes through and/or is applied to the DUV light source 550 to generate an output (such as the output beam 541) that has the specifications requested by the end-user. Without optical elements that include a structure such as the structure 101, 201A, 201B, or 301, the DUV light source 550 produces more light to compensate for the fresnel reflection losses incurred at through interaction with optical elements. This additional light is referred to as compensation light. Using an optical element that includes a structure such as the structure 101, 201A, 201B, or 301 reduces fresnel reflection losses such that the compensation light may be minimized or eliminated. Because less total light is generated to provide the same amount of light in the output beam 541, lower operating voltages may be applied to the electrodes 562a_1, 562b_1, 562a_2, and/or 562b_2. Moreover, by reducing the amount of compensation light, lower thermal loads exist on optical elements that interact with the intermediate light beam i and/or the seed beam 542. Thus, these optical elements experience lower and less severe thermal transients when the power load of the DUV light source 550 changes rapidly (for example, when an operating state of the DUV light source changes). Furthermore, the reduced amount of compensation light results in lower fluence on bulk substrates and coatings and thus longer lifetimes for these components. Additionally, because the features in a structure such as the structure 101, 201A, 201B, or 301 may be arranged to reduce fresnel reflections for an expected angle of incidence, using an optical element with a structure such as the structure 101, 201A, 201B, or 301 may result in greater flexibility in adjusting optic incidence angles to meet design goals without as much concern for fresnel reflection losses and also may result in greater design flexibility. Also, by reducing fresnel reflection losses, scattered stray light is reduced. Accordingly, the overall performance of the DUV light source 550 is improved by using one or more optical elements that include a structure such as the structure 101, 201A, 201B, or 301.

Additionally, using an optical element having a structure 101, 201A, 201B, or 301 in the PA 568 increases the efficiency of the PA 568. Increasing the efficiency enables the PA 568 cavity to produce the same amount of power with a lower power within the cavity, and the intercavity beam width (the beam width of a beam that propagates in the PA 568). A smaller intracavity beam width allows the use of smaller cavity optics, which may reduce the overall size and/or expense of the PA 568. Finally, increasing efficiency allows the use of a higher reflectivity optics in the coupler 691. Using higher reflectivity optics allows the PA 568 to produce the same output power but at a longer pulse length.

Other optical elements may be implemented to include a structure, such as the structures 101, 201A, 201B, and 301, that produces a gradient index of refraction to reduce or eliminate fresnel reflections. For example, the beam turning optical element 582 may be implemented as a crystalline structure (such as CaF2) machined into a prism having two reflecting surfaces, 596a, 596b as shown in FIG. 6C. In these implementations, the intermediate light beam i is transmitted into the beam turning optical element 582 by a transmissive surface 596c. The transmissive surface includes a protective coating 604C that is similar to the protective coatings 104, 204A, 204C, and 304 and a structure 601C that is similar to the structures 101, 201B, 201C, 301.

According to other implementations, various other arrangements of optical elements such as shown in FIGS. 6A-6D, may be used.

Moreover, other transmissive optical components in the light source 560 may include structures similar to the structures 101, 201B, 201C, 301. For example one or more of the prisms 693, 694, and 695 may include a structure similar to the structures 101, 201B, 201C, 301.

Still other implementations are within the scope of the claims.

Other aspects of the invention are set out in the following numbered clauses.

1. An optical element for a deep-ultraviolet light source, the optical element comprising:
a crystalline substrate;
a coating on an exterior surface of the crystalline substrate, the coating having a thickness along a direction that extends away from the exterior surface; and
a structure on and/or in the coating, the structure comprising a plurality of features that extend away from the crystalline substrate along the direction, wherein the features comprise an amorphous dielectric material and are arranged such that an index of refraction of the structure varies along the direction.

2. The optical element of clause 1, wherein the crystalline substrate comprises calcium fluoride ($CaF_2$).

3. The optical element of clause 1, wherein an extent of the features along the direction is no greater than the thickness.

4. The optical element of clause 3, wherein all of the features of the structure are within the coating.

5. The optical element of clause 1, wherein the features and the coating are made of the same dielectric material.

6. The optical element of clause 1, wherein one or more of the features extends outside of the coating.

7. The optical element of clause 1, wherein the amorphous dielectric material comprises fused silica or alumina.

8. The optical element of clause 1, wherein each of the plurality of features is the same, and the plurality of features are arranged relative to each other in a regular and repeating pattern.

9. The optical element of clause 1, wherein each of the plurality of features is the same, and the plurality of features are arranged relative to each other in a random or pseudo-random manner.

10. The optical element of clause 1, wherein each of the plurality of features is associated with spatial characteristics, and at least one spatial characteristic of one of the plurality of features is different from that spatial characteristic of at least one of the other features, and wherein the spatial characteristics comprise any of height, width, and shape.

11. The optical element of clause 1, wherein the index of refraction of the structure varies linearly along the direction.

12. The optical element of clause 1, wherein the index of refraction of the structure varies along the direction from a value that is substantially equal to an index of refraction of the crystalline substrate to a value that is substantially equal to an index of refraction of a fluid at the optical element.

13. The optical element of clause 12, wherein the fluid comprises a nitrogen ($N_2$) purge gas.

14. The optical element of clause 1, wherein the features have an extent along the direction of 100 nanometers (nm) or less.

15. The optical element of clause 1, wherein the direction is substantially orthogonal to a surface of the crystalline substrate.

16. The optical element of clause 2, wherein, in operational use, deep-ultraviolet (DUV) light having a wavelength of 193 nanometers (nm) is incident on the coating, the coating protects the $CaF_2$ substrate by mitigating removal of fluorine from the substrate, and the index of refraction of the structure varies along a direction of propagation of the DUV light such that reflections of the DUV light from the optical element are reduced.

17. The optical element of clause 1, wherein the coating completely covers a surface of the crystalline substrate.

18. A deep-ultraviolet (DUV) light source comprising:
a chamber comprising a housing configured to enclose a gaseous gain medium; and
at least one optical element configured to transmit DUV light, wherein the at least one optical element comprises:
a substrate comprising a crystalline material configured to transmit DUV light;
a coating on an exterior surface of the substrate, the coating having a thickness along a direction that extends away from the exterior surface; and
a structure on and/or in the coating, the structure comprising a plurality of features that extend away from exterior surface along the direction, wherein the features comprise an amorphous material and the features are arranged such that an index of refraction of the structure varies along the direction.

19. The DUV light source of clause 18, wherein one or more of the plurality of features extends a distance along the direction, and the distance is less than the wavelength of DUV light transmitted by the at least one optical element.

20. The DUV light source of clause 18, wherein the plurality of features are arranged relative to each other such that a spacing between any two adjacent features is within an order of magnitude of the wavelength of DUV light transmitted by the at least one optical element.

21. The DUV light source of clause 18, wherein the crystalline material configured to transmit DUV light comprises calcium fluoride ($CaF_2$).

22. The DUV light source of clause 18, wherein the index of refraction of the structure varies along the direction from a value that is substantially equal to an index of refraction of the crystalline substrate to a value that is substantially equal to an index of refraction of a fluid that surrounds the optical element.

23. The DUV light source of clause 22, wherein the fluid comprises a nitrogen ($N_2$) purge gas.

24. The DUV light source of clause 18, wherein the structure is within the coating.

25. The DUV light source of clause 18, wherein the structure is in and on the coating, such that the structure is partially within the coating.

26. The DUV light source of clause 18, wherein the chamber further comprises:
a first window on a first side of the housing; and
a second window on a second side of the housing, the second side of the housing being opposite the first side of the housing, and wherein the at least one optical element comprises the first window and the second window, and the coating is on the first window and the second window.

27. The DUV light source of clause 26, wherein the coating on the first window and the coating on the second window are disposed on surfaces of the respective windows that are exterior to the housing.

28. The DUV light source of clause 26, further comprising a second chamber, the second chamber comprising:
a second housing configured to hold a gaseous gain medium in the interior of the second housing;
a third window on a first side of the second housing; and
a fourth window on a second side of the second housing, the second side of the second housing being opposite the first side of the second housing, wherein the at least one optical element further comprises the third window and the fourth window.

29. The DUV light source of clause 26, wherein an exterior surface of the first window and an exterior surface of the second window are non-perpendicular to a direction of propagation of the DUV light.

30. The DUV light source of clause 18, wherein the at least one optical element comprises one or more of a prism, a beam splitter, a lens, and an optical compensator.

31. The DUV light source of clause 18, wherein the index of refraction varies along a direction of propagation of the DUV light.

32. The DUV light source of clause 18, wherein, in operational use, DUV light having a wavelength of 193 nanometers (nm) is incident on the coating, the coating protects the $CaF_2$ substrate by mitigating removal of fluorine from the substrate, and the index of refraction of the structure varies along a direction of propagation of the DUV light such that reflections of the DUV light from the optical element are reduced.

33. The DUV light source of clause 18, wherein the coating completely covers a surface of the crystalline substrate.

What is claimed is:

1. An optical element for a deep-ultraviolet light source, the optical element comprising:
a crystalline substrate;
a protective coating on an exterior surface of the crystalline substrate, the protective coating having a thickness along a direction that extends away from the exterior surface; and
a structure comprising a plurality of features partially or completely within the protective coating and extending away from the crystalline substrate along the direction, wherein the features comprise an amorphous dielectric material and are arranged such that their index of refraction varies along the direction.

2. The optical element of claim 1, wherein the crystalline substrate comprises calcium fluoride ($CaF_2$).

3. The optical element of claim 1, wherein an extent of the features along the direction is no greater than the thickness.

4. The optical element of claim 1, wherein the features and the protective coating are made of an amorphous dielectric material.

5. The optical element of claim 1, wherein one or more of the features extends outside of the protective coating.

6. The optical element of claim 1, wherein each of the plurality of features is the same, and the plurality of features are arranged relative to each other in a random or pseudo-random manner.

7. The optical element of claim 1, wherein the index of refraction of the features varies along the direction from a value that is substantially equal to an index of refraction of the crystalline substrate to a value that is substantially equal to an index of refraction of a fluid at the optical element.

8. The optical element of claim 1, wherein the direction is substantially orthogonal to a surface of the crystalline substrate.

9. A deep-ultraviolet (DUV) light source comprising:
a chamber comprising a housing configured to enclose a gaseous gain medium; and
at least one optical element configured to transmit DUV light in the DUV light source, wherein the at least one optical element comprises:
a substrate comprising a crystalline material configured to transmit DUV light;
a protective coating on an exterior surface of the substrate, the protective coating having a thickness along a direction that extends away from the exterior surface; and
a structure comprising a plurality of features partially or completely within the protective coating and extending away from the exterior surface along the direction, wherein the features comprise an amorphous material and the features are arranged such that their index of refraction varies along the direction.

10. The DUV light source of claim 9, wherein one or more of the plurality of features extends a distance along the direction, and the distance is less than the wavelength of DUV light transmitted by the at least one optical element.

11. The DUV light source of claim 9, wherein the plurality of features are arranged relative to each other such that a spacing between any two adjacent features is within an order of magnitude of the wavelength of DUV light transmitted by the at least one optical element.

12. The DUV light source of claim 9, wherein the crystalline material configured to transmit DUV light comprises calcium fluoride ($CaF_2$).

13. The DUV light source of claim 9, wherein the features are in and on the protective coating, such that the structure is partially within the protective coating.

14. A deep-ultraviolet (DUV) light source comprising:
a chamber comprising:
a housing configured to enclose a gaseous gain medium;
a first window on first side of the housing; and
a second window on a second side of the housing, the second side of the housing being opposite the first side of the housing; and
at least one optical element configured to transmit DUV light, wherein the at least one optical element comprises:

a substrate comprising a crystalline material configured to transmit DUV light;
a protective coating on an exterior surface of the substrate, the protective coating having a thickness along a direction that extends away from the exterior surface; and
a structure in and on the protective coating, the structure comprising a plurality of features that extend away from the exterior surface along the direction, the features comprise an amorphous material, and the features are arranged such that an index of refraction of the structure varies along the direction;
wherein the at least one optical element comprises the first window and the second window, and the protective coating is on the first window and the second window.

15. The DUV light source of claim 14, wherein the protective coating on the first window and the protective coating on the second window are disposed on surfaces of the respective windows that are exterior to the housing.

16. The DUV light source of claim 14, wherein an exterior surface of the first window and an exterior surface of the second window are non-perpendicular to a direction of propagation of the DUV light.

17. The DUV light source of claim 9, wherein the at least one optical element comprises one or more of a prism, a beam splitter, a window having a surface non-perpendicular to a direction of propagation of the DUV light, and an optical compensator.

18. The DUV light source of claim 9, wherein the index of refraction varies along a direction of propagation of the DUV light.

19. The DUV light source of claim 12, wherein, in operational use, DUV light having a wavelength of 193 nanometers (nm) is incident on the protective coating, the protective coating protects the $CaF_2$ substrate by mitigating removal of fluorine from the substrate, and the index of refraction of the structure varies along a direction of propagation of the DUV light such that reflections of the DUV light from the optical element are reduced.

20. The DUV light source of claim 9, wherein the index of refraction of the structure varies along the direction from a value that is substantially equal to an index of refraction of the crystalline substrate to a value that is substantially equal to an index of refraction of a purge gas.

21. The DUV light source of claim 9, wherein the features are entirely within the protective coating.

22. A deep-ultraviolet (DUV) light source comprising:
a power amplifier (PA) comprising a discharge chamber configured to enclose a gaseous gain medium, the discharge chamber comprising at least one discharge chamber window configured to transmit DUV light, wherein the at least one discharge chamber window comprises:
a substrate comprising a crystalline material configured to transmit DUV light;
a coating on an exterior surface of the substrate, the coating having a thickness along a direction that extends away from the exterior surface; and
a structure on and/or in the coating, the structure comprising a plurality of features that extend away from exterior surface along the direction, wherein the features comprise an amorphous material and the features are arranged such that an index of refraction of the structure varies along the direction.

23. The DUV light source of claim 22, wherein the exterior surface of the substrate is a surface that faces away from an interior of the discharge chamber.

24. The DUV light source of claim 23, wherein the chamber of the PA further comprises a second discharge chamber window configured to transmit DUV light, wherein the second discharge chamber window comprises:
a second substrate comprising a crystalline material configured to transmit DUV light;
a coating on an exterior surface of the second substrate, the coating having a thickness along a direction that extends away from the exterior surface; and
a structure on and/or in the coating, the structure comprising a plurality of features that extend away from exterior surface along the direction, wherein the features comprise an amorphous material and the features are arranged such that an index of refraction of the structure varies along the direction and wherein the exterior surface of the second substrate is a surface that faces away from the interior of the discharge chamber.

25. The DUV light source of claim 22, wherein the exterior surface of the substrate is a planar surface and is positioned at an angle other than 90 degrees relative to the direction of a light beam transmitted through the substrate into the discharge chamber.

26. The DUV light source of claim 22, wherein the PA further comprises:
a beam coupling optical system; and
a beam turning optical element;
wherein the beam coupling optical system is configured to receive a light beam and direct the light beam through the discharge chamber, and the beam turning optical element is configured to modify or change a direction of the light beam so that it is sent back into the discharge chamber.

27. The DUV light source of claim 26, wherein one or more of the beam coupling optical system and the beam turning optical element comprises:
at least one additional substrate comprising a crystalline material configured to transmit DUV light;
a coating on an exterior surface of the additional substrate, the coating having a thickness along a direction that extends away from the exterior surface; and
a structure on and/or in the coating, the structure comprising a plurality of features that extend away from the exterior surface along the direction, wherein the features comprise an amorphous material and the features are arranged such that an index of refraction of the structure varies along the direction.

28. The DUV light source of claim 22, wherein the PA is a ring amplifier.

29. The optical element of claim 1, wherein the protective coating has the same or very similar refractive index as that of the crystalline substrate.

* * * * *